US008919961B2

(12) United States Patent
Planting

(10) Patent No.: US 8,919,961 B2
(45) Date of Patent: Dec. 30, 2014

(54) INFLATABLE, PRESSURE-CONTROLLED, PORTABLE LINE-CONCENTRATING HELIOSTAT

(71) Applicant: Nelson Planting, Berkeley, CA (US)

(72) Inventor: Nelson Planting, Berkeley, CA (US)

(73) Assignee: Nelson Planting, Berkeley, CA (US)

( * ) Notice: Subject to any disclaimer, the term of this patent is extended or adjusted under 35 U.S.C. 154(b) by 100 days.

(21) Appl. No.: 13/873,782

(22) Filed: Apr. 30, 2013

(65) Prior Publication Data

US 2013/0306135 A1    Nov. 21, 2013

Related U.S. Application Data

(60) Provisional application No. 61/640,715, filed on Apr. 30, 2012.

(51) Int. Cl.

| G02B 7/183 | (2006.01) |
| F24J 2/10 | (2006.01) |
| F21S 11/00 | (2006.01) |
| G02B 26/08 | (2006.01) |
| H01L 31/052 | (2014.01) |
| G02B 5/08 | (2006.01) |
| F24J 2/06 | (2006.01) |

(52) U.S. Cl.
CPC *F24J 2/1052* (2013.01); *F24J 2/10* (2013.01); *F21S 11/00* (2013.01); *G02B 7/183* (2013.01); *G02B 26/0825* (2013.01); *H01L 31/0525* (2013.01); *G02B 5/0816* (2013.01); *Y02E 10/47* (2013.01); *F24J 2002/1076* (2013.01); *F24J 2/06* (2013.01); *Y02E 10/52* (2013.01)

USPC .............. 353/3; 353/99; 359/852; 359/853

(58) Field of Classification Search
CPC .............. F24J 2/06; F24J 2/10; F24J 2/1052; F24J 2/12; F24J 2/125; F24J 2/38; F24J 2002/1076; F21S 11/00; F21S 11/002; F21S 11/005; Y02E 10/47; Y02E 10/52; G02B 5/0816; G02B 26/0825; G02B 7/183
USPC .............. 353/3, 98–99; 359/850–853; 136/243–244, 246
See application file for complete search history.

(56) References Cited

U.S. PATENT DOCUMENTS

| 4,182,307 | A | * | 1/1980 | Brindle et al. | 126/625 |
| 4,192,583 | A | * | 3/1980 | Horton | 353/3 |
| 5,227,618 | A | * | 7/1993 | Shingleton | 250/203.4 |
| 6,994,082 | B2 | * | 2/2006 | Hochberg et al. | 126/696 |
| 7,374,137 | B2 | * | 5/2008 | Staney | 248/122.1 |
| 7,382,332 | B2 | * | 6/2008 | Essig et al. | 343/878 |
| 7,612,735 | B2 | * | 11/2009 | Essig et al. | 343/915 |
| 7,997,264 | B2 | * | 8/2011 | Sankrithi | 126/697 |
| 2005/0103329 | A1 | * | 5/2005 | Essig et al. | 126/697 |
| 2009/0260620 | A1 | * | 10/2009 | Winger et al. | 126/600 |
| 2010/0101559 | A1 | * | 4/2010 | Grant et al. | 126/600 |
| 2010/0186733 | A1 | * | 7/2010 | Hoefler | 126/625 |
| 2010/0229850 | A1 | * | 9/2010 | Sankrithi | 126/601 |
| 2012/0073625 | A1 | * | 3/2012 | Christensen | 136/246 |

* cited by examiner

*Primary Examiner* — Tony Ko
*Assistant Examiner* — Jori S Reilly-Diakun

(57) ABSTRACT

Inflatable, flexible, collapsible, linear solar concentrator and heliostat designs, made primarily of flexible and elastic sheets enclosing and separating air-tight chambers which are elongated along and parallel to a main axis, with the chambers pressurized to different pressures form a structure and control the focus and rotation of a mirror.

11 Claims, 9 Drawing Sheets

FIG. 7
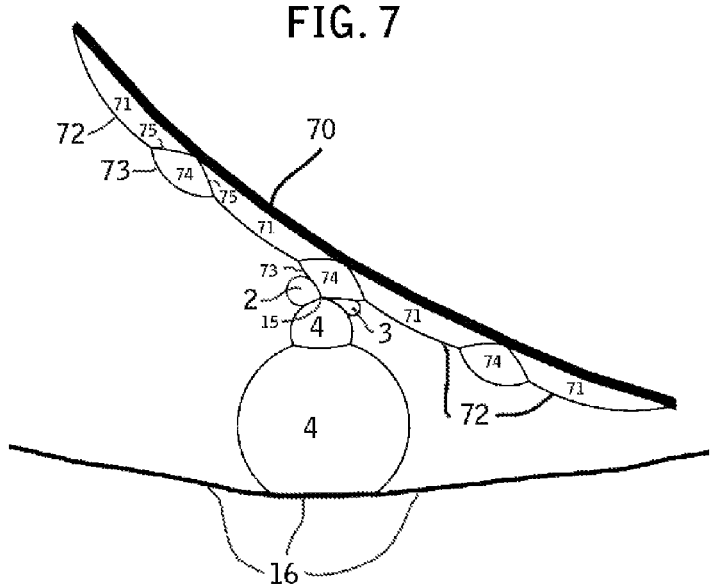
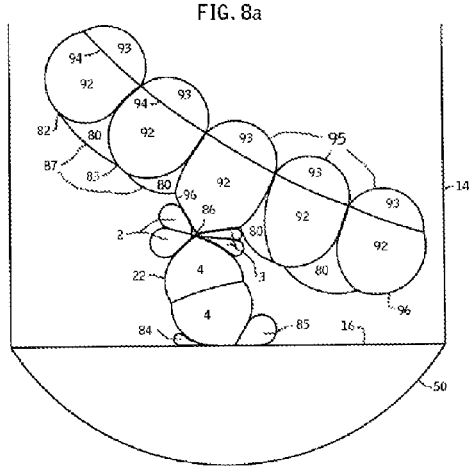
FIG. 8a
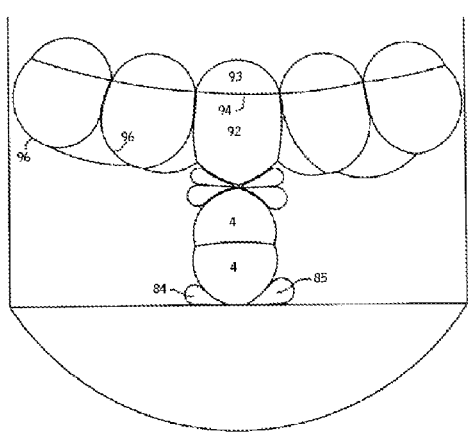
FIG. 8b

INFLATABLE, PRESSURE-CONTROLLED, PORTABLE LINE-CONCENTRATING HELIOSTAT

CROSS-REFERENCE TO RELATED APPLICATIONS

This application claims the benefit of U.S. Provisional Application No. 61/640,715, filed on Apr. 30, 2012.

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISK APPENDIX

Not Applicable

BACKGROUND OF THE INVENTION

1. Field of the Invention

The present invention is in the field of solar energy concentration, specifically in inflatable line-focus reflector heliostats for use in linear fresnel reflector systems.

2. Description of the Related Art

Solar energy collector systems of the type referred to as Linear Fresnel Reflector ("LFR") systems are relatively well known and are constituted by a field of linear reflectors that are arrayed in parallel side-by-side rows and are oriented to reflect incident solar radiation to a common elevated receiver.

Significant expenses in these LFR systems are the reflectors and the heliostatic equipment necessary to control their rotation. The reflectors are often rigid constructions of glass and/or metal, resulting in a high cost per reflector area and heavy mirrors, as well as rigid support structures to support these reflectors. The heliostatic equipment is usually a finite number of actuators, like motors, which rotate the support structure, which communicates torsional stabilizing forces to the reflectors. These reflectors are generally fixed to one focal length, which limits the maximum concentration.

Several proposed designs attempt to lower the cost by using a tensioned reflective sheet along with a pressure differential across the sheet to form a spherically-shaped or cylindrically-shaped reflector with a variable focus, from flexible reflective sheets (such as U.S. Pat. Nos. 8,235,035 and 7,997,264). However, these designs still include rigid heliostatic means and other rigid components.

U.S. Pat. No. 3,495,502 describes a pneumatically-actuated hinge, however, this hinge is still built from rigid materials.

U.S. Pat. No. 5,227,618 describes an apparatus that uses fluid pressure in flexible chambers to rotate a "radiation detector" such as a solar panel or reflector, as well as electronics for controlling it. However, the designs disclosed in that patent rely on gravity and are intended more for solar panels.

BRIEF SUMMARY OF THE INVENTION

The present invention is related to providing low-cost inflatable line-focusing heliostats for use in solar concentration, these heliostats comprising elongated structures formed by independently-pressurized chambers bounded by flexible sheets and elastic sheets which are parallel to a main axis. These elongated structures, along their linear working sections are able to move within a working plane that is perpendicular to the main axis, thereby controllably rotating and supporting a reflector built into the structure and supporting the reflector along its entire length, mostly eliminating torsional loads on the reflectors and allowing them to be made from thinner material and allowing each reflector to be less wide.

Such elongated structures can be manufactured from readily available and convenient materials such as rolls of plastic and metal, and can be arranged in parallel on a large base sheet. There is also an advantage in manufacture of these elongated structures, since roll-to-roll manufacturing methods may be employable, as well as expertise from the field of package manufacture.

Another advantage of the disclosed invention is its collapsibility and light weight. In un-inflated form, the base sheet and reflectors are only as thick as a few flexible sheets and a reflector, and may be flexible enough to be rolled onto a spool or folded.

It is expected that a large base sheet, for example a 20 meters wide by 10 meters deep sheet, supporting an array of 200 inflatable heliostats arranged in parallel, can be shipped on a spool and installed by a few people in less than an hour.

These heliostats can be used with an external solar collector, such as a photovoltaic ("PV") strip, a secondary reflector and receiver, or a heat exchanger. They can also be used in fully-enclosed designs, where an inflated, manufactured enclosure holds multiple reflectors and a receiver such as a PV strip, simplifying installation and mostly eliminating wind loads on the reflectors.

BRIEF DESCRIPTION OF THE DRAWINGS

FIG. 7 shows a front cross sectional view of a variation of the inflatable elastic heliostat of FIG. 2, with additional corrective chambers to shape the elastic reflector.

FIGS. 8a, 8b show front cross sectional views of another type of inflatable heliostat made from a series of suspended sheet reflectors (also referred to as "sandwich reflectors"), in two positions.

DETAILED DESCRIPTION OF THE INVENTION

Figure 1:
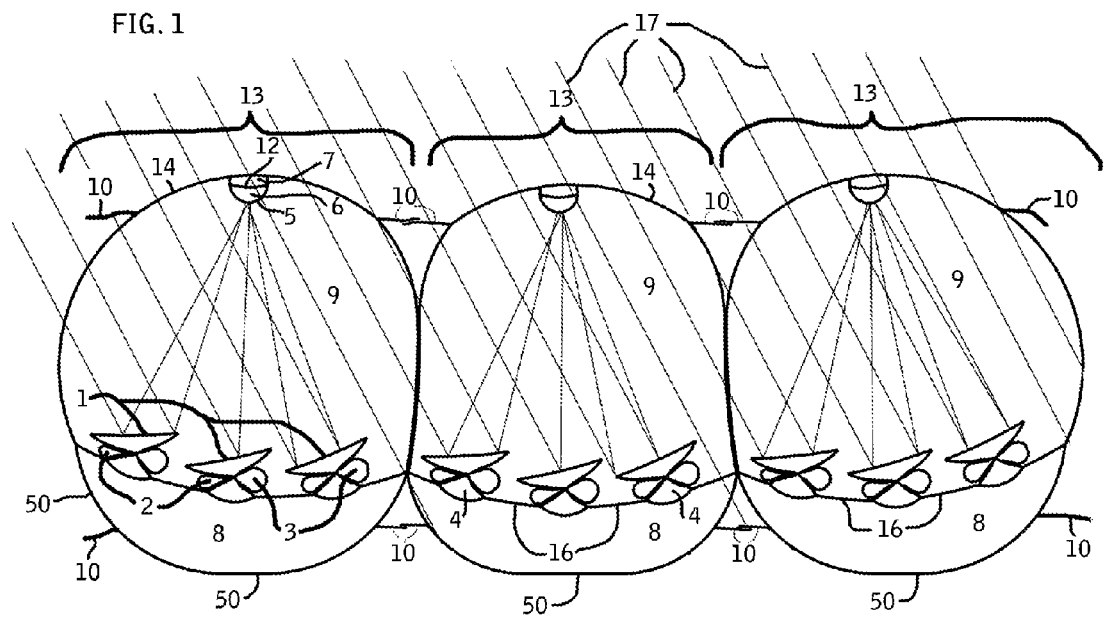
FIG. 1 is a front cross sectional view of three concentrator units attached together, each with three inflatable elastic heliostats mounted inside.

Inflatable, flexible linear single axis concentrating heliostat and collector designs, made primarily from flexible sheet materials (e.g. plastic), where the structure and optics are controlled by varying the pressure within the chambers.

The heliostatic means is made primarily of flexible sheets, which are airtight and do not hold a shape, but have relatively high tensile strength so they do not stretch over time. The sheets enclose chambers which are inflated to different pressures to form adjustable structural components which are parallel to a main axis and elongated to arbitrary lengths along this main axis.

Several types of reflectors are disclosed which would be preferable to mount on such a heliostatic means. An elastic reflector may be deformed by air pressure, but returns to its original shape when no pressure is applied. Such an elastic reflector is pre-formed to a parabola-like shape, and its focus can be adjusted by adjusting the pressure in a chamber or chambers adjacent to it.

A "sandwich reflector" is made of a reflective flexible sheet which does not hold its shape, which is suspended between two air chambers, and its curvature is affected by the combined effects of the air pressure differential across the sheet and the tension in the sheet. The sandwich reflector which is disclosed requires a transparent sheet in front of the reflective sheet, which requires the light to pass through the transparent sheet twice, which can reflect or absorb light and therefore lower power output. Transparent sheets may also degrade over time, more than opaque sheets, due to ultraviolet light.

To achieve optimal concentration of solar rays onto a fixed collector that is a short distance to the reflectors relative to the width of the reflectors, the reflectors must change their focus depending on the angle of incoming sunlight. For example, if the collector is 1 meter from the reflectors and the reflectors are 0.2 meters wide, concentration factors can be improved by focusing the reflectors.

In the art, it should be assumed that all chambers are airtight and each connected to a means of providing inflation and deflation, even when multiple chambers of that number are shown in a drawing.

In the art, when a front cross sectional view is shown of a reflector, a concentrator, or a collector, it should be assumed that the sheets, reflectors, and collectors contain a linear section which is elongated along and parallel to a main axis.

It should further be assumed that all sheets and chambers are airtight.

A front view cross section of a concentrator unit can be represented by a 2 dimensional undirected graph without any crossing edges. From front to back, the topology of this graph does not change but the graph edges may change in length. A graph edge represents an airtight sheet, a graph vertex represents a connection of sheets (e.g. a heat weld), and areas bounded by graph edges represent chambers. Along a linear section (a section which is parallel to a main axis running front to back), the length of the edges do not change. These graph edges are drawn as arcs in the drawings, since this is the shape they actually form due to the effects of tension and air pressure.

One possible method of manufacture is also disclosed. In this method of manufacture, sheets are drawn from rolls and are attached together, e.g. glued, heat welded, taped together, to form the structures. First, the sheets are drawn from rolls. Movable printers then print a machine-readable pattern on the sheets and the excess material is cut from the edges. Then, the sheets are pulled through steerable pattern reading/sheet attaching units, which are steered by a computer based on feedback from the reading units, much like a line-following robot would do. They are then attached to other sheets along seams using e.g. heat welders.

FIG. 1 shows a front cross sectional view of a linear section of three concentrator units 13 attached together, with each concentrator unit having three inflatable heliostats and one light collector. Rotator chambers 2 and 3, support chambers 4, bottom chamber 8, and housing chamber 9 are pressurized when the device is in operation, and each individual chamber is connected to a an external means of providing inflation and deflation. Coolant chambers 6 and 7 are separated by sheet 12 and are filled with coolant, with a source of coolant connected to chamber 7 and a sink of coolant connected to chamber 6. Photovoltaic strip 5 is attached to the bottom of coolant chamber 6 so it can transfer heat to coolant in coolant chamber 6. Concentrator units 13 are attached together via transparent sheets 10, which are attached to transparent housing sheets 14, allowing a maintenance crew or a factory to replace individual concentrator units by severing the connections between sheets 10 and attaching another concentrator unit in its place. Bottom sheet 50 is a flexible sheet and is connected to housing sheet 14 and base sheet 16, and is preferably made from durable material since it could be in contact with e.g. the ground. Elastic reflector trough 1, at rest, forms a substantially parabolic shape with a focal length that is shorter than the focal length needed to focus light rays 17 to the PV cell 5 when incoming light rays are parallel to the direction from the reflector to PV cell 5. Light rays 17 pass through the transparent sheets, reflect off of elastic reflector troughs 1, and land on photovoltaic strip 5. The inflatable heliostats are attached to base sheet 16, which allows bottom sheet 50 to rest on uneven ground, while base sheet 16 and the rest of the structure stay parallel to a main axis running front to back.

FIGS. 2a, 2b, 2c, 2d show front cross sectional views of a single inflatable elastic heliostat shown in FIG. 1 in various positions, demonstrating the effect of inflating and deflating rotator chambers 2 and 3 to change the rotation of elastic reflector trough 1 and reflector chamber 11, in order to reflect different directions of light rays 17 towards a collector. The concave side, which faces outward from reflector chamber 11, is optically reflective. This pivot and support chamber (chambers 2, 3 and 4) is used in other designs. The pressure in reflector chamber 11 is increased to apply more force to the convex side of elastic reflector trough 1, decreasing the concavity of the concave side of elastic reflector trough 1. Chambers 2 are inflated while chambers 3 are deflated to rotate reflector chamber 11 clockwise, and this motion may be reversed by reversing this inflation and deflation. Rotator chambers 2 and 3 are shown in contact with support chamber 4 and reflector chamber 11 and apply force to both of these chambers when inflated. Support chamber 4 may be depressurized to allow further rotation of the reflector.

Figure 3A:
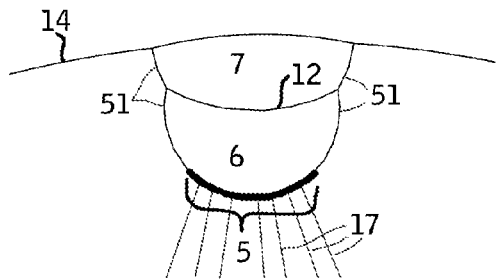
FIGS. 3a, 3b show a front cross sectional view of a collector with chambers for coolant, with a photovoltaic receiver mounted in different positions.
Figure 3B:
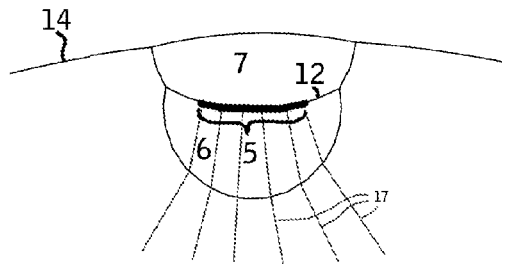

FIGS. 3a and 3b show a front cross sectional view of a collector assembly connected to housing sheet 14. A collector assembly comprises photovoltaic ("PV") cell 5, flexible sheet 12, flexible sheet 51, and coolant chambers 6 and 7. Coolant chambers 6 and 7 are connected to housing sheet 14 and PV cell 5 is connected to coolant chambers 6 or 7 and is inside the housing chamber. FIG. 3a shows a design with PV cell 5 on the bottom of chamber 6, able to transfer heat to coolant in chamber 6. FIG. 3b shows a variation of FIG. 3a, where a liquid coolant in chamber 6 acts as a convex lens, further concentrating the light rays 17 on PV cell 5. PV cell 5 is mounted on sheet 12 in this case. The temperature differential between chambers 6 and 7 may allow the PV cell to act as a thermocouple, since both PV cells and thermocouples are generally semiconductor NP junctions. Sheet 12 separates coolant chambers 6 and 7 in both FIG. 3a and FIG. 3b. The designs shown in FIG. 3a and FIG. 3b are interchangeable. A black sheet may replace PV cell 5 to make a water heater.

Figure 2A:
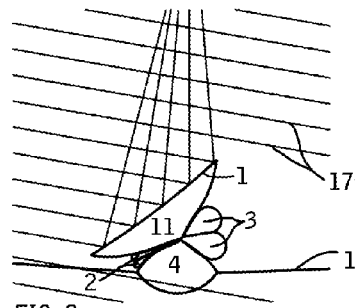
FIGS. 2a, 2b, 2c, 2d show front cross sectional views of a single inflatable elastic heliostat with the reflector at various rotations.
Figure 2B:
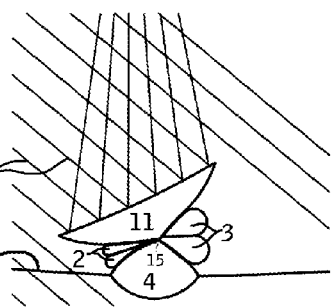
Figure 2C:
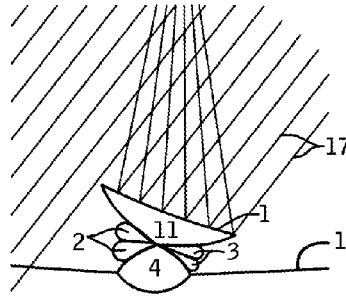
Figure 2D:
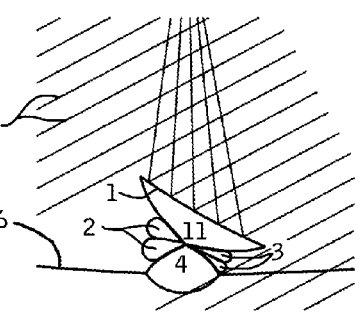
Figure 4A:
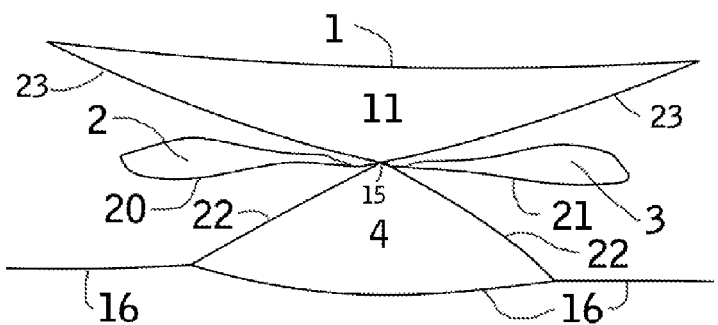
FIGS. 4a, 4b show a front cross sectional view of a deflated inflatable elastic heliostat with various pivot designs.
Figure 4B:
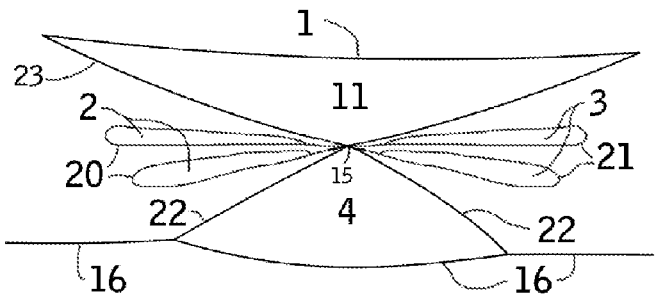

FIG. 4a shows a front cross sectional view of the inflatable elastic heliostat shown in FIG. 2a. Flexible sheet section 20 surrounds rotator chamber 2, and flexible sheet section 21 surrounds rotator chamber 3 (sheet sections 20 and 21 are two halves of one sheet; together they are referred to as flexible sheet 20/21). Flexible sheet 23 and elastic reflector trough 1 surround reflector chamber 11. Flexible sheet 23 is wider than elastic reflector trough 1. Flexible support sheet 22 and flexible base sheet 16 surround support chamber 4. Flexible sheets 23, 20/21, and 22 are all connected along pivot seam 15. FIG. 4b shows a variation on the pivot design shown in FIG. 4a, where there are two of flexible sheet 20/21, two of rotator chamber 2, and two of rotator chamber 3. Having more rotator chambers like this allows a further rotation and greater stability. Since these two designs of this pivot are very similar, they can be used interchangeably.

Figure 5A:
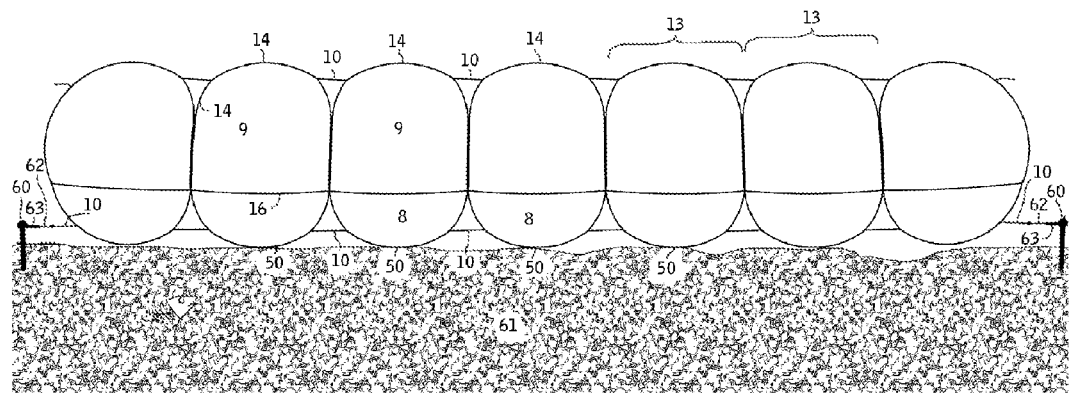
FIG. 5a shows a front cross sectional view of a series of concentrator units without reflectors or collectors, mounted on flat ground under tension.
Figure 5B:
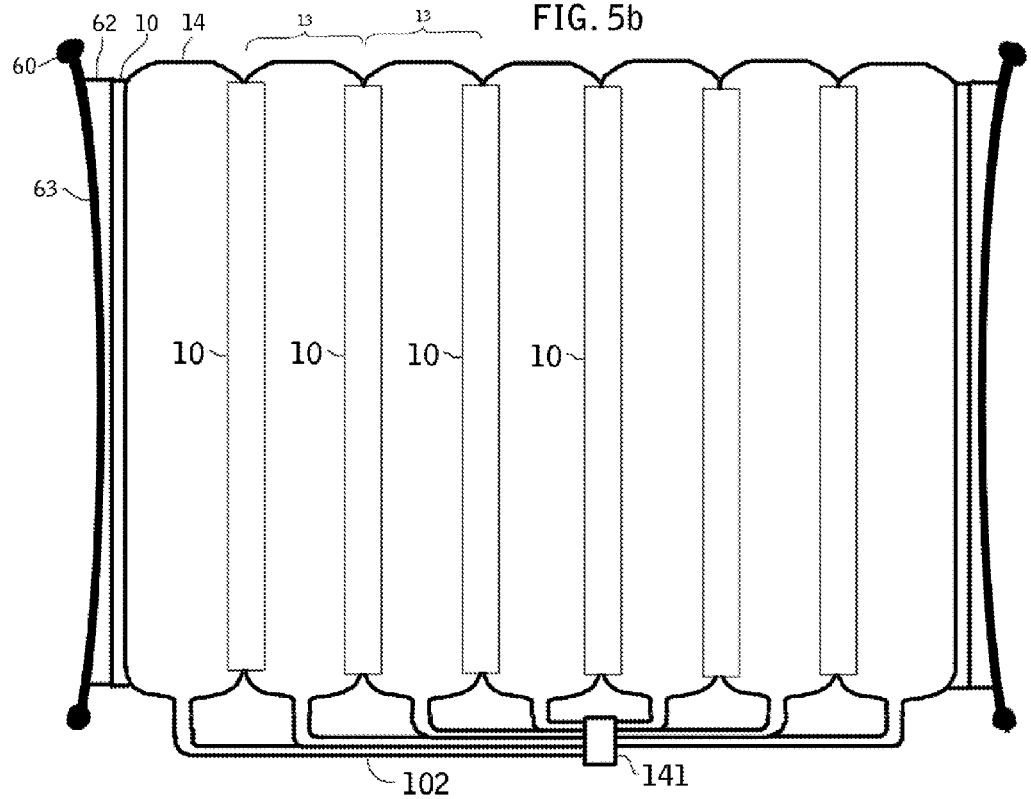
FIG. 5b shows a top view of the same.

FIGS. 5a, 5b show a series of concentrator units without reflectors or collectors. FIG. 5a shows a front cross sectional view, FIG. 5b shows a top view. Concentrator units 13 are connected together by transparent flexible sheets 10 using a form of temporary or permanent adhesion (heat weld, glue, mechanical attachment). Housing chambers 9 are bounded by transparent housing sheets 14 and base sheets 16. Bottom chambers 8 are bounded by bottom sheets 50 and base sheets 16. Stakes 60 secure the ends of rope 63 to fixed positions relative to the ground 61. Rope 63 connects to sheet 62, which pulls sheets 10 at the ends of the series of concentrator units. The series of concentrator units is pulled from both sides, which secures them to a solid structure such as the ground, and keeps them in a linear shape, where the components of the structure are substantially parallel to the main axis running front to back. Also depicted in FIG. 5b are the connections from the tubing sections 102 of a the concentrator units 13 and connecting to control box 141. The bottom chambers 8 can have a low pressure, to allow bottom sheet 50 to rest on unlevel ground 61, separating the forces from unlevel ground from the rest of the structure and anything attached to base sheet 16.

Figure 6A:
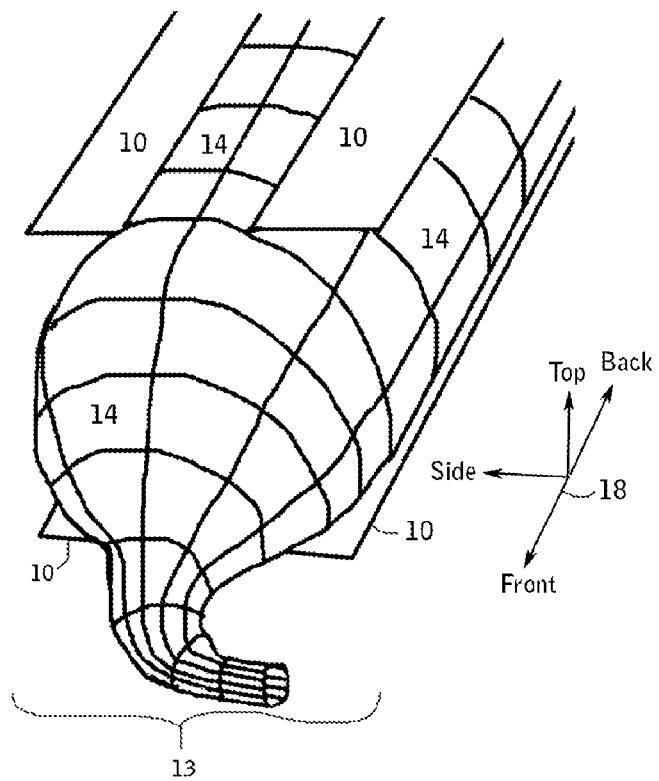
FIG. 6a shows a perspective view of a housing sheet which can hold inflatable heliostats and photovoltaic strips.
Figure 6B:
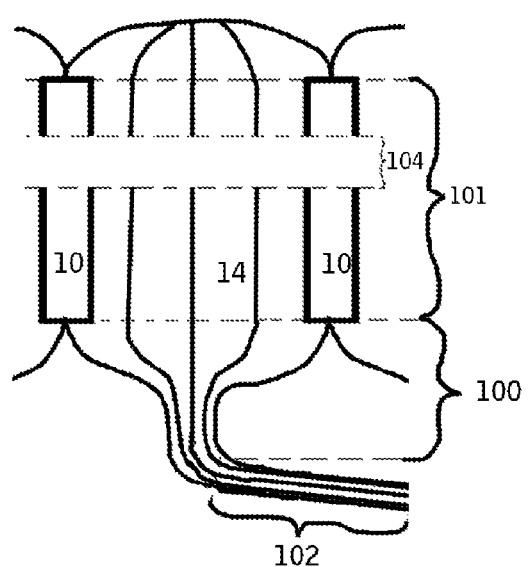
FIG. 6b shows a top view of the same.

FIG. 6a shows a perspective view of a concentrator unit 13, without reflectors or concentrators. In a completed series of concentrator units, sheets 10 are fastened together with sheets 10 of neighboring concentrator units; here they are shown disconnected. FIG. 6b shows a top-down view of several concentrator units. Linear section 101 is long and straight; and only a small section of this is drawn, with section 104 removed from the drawing. Tapering section 100 is generally much shorter than linear section 101. Tubing section 102 is made long enough to connect the linear section 101 to a means of inflation and deflation. Transparent flexible sheets 10 are attached to the sides of housing sheets 14 along linear section 101. Coordinate system 18 shows the direction of the front, side, top and back that is used in all of the drawings. The main axis runs front to back.

FIG. 7 shows a front cross section of another type of reflector assembly based on an elastic reflector trough, which is similar to the design shown in FIG. 4. Elastic reflector trough 70 is pre-formed to a substantially parabolic shape during manufacture and its concave side is optically reflective. During operation, elastic reflector trough 70 is shaped by air pressure in corrective chambers 71 and corrective chambers 74. A higher pressure in one of chambers 71 causes elastic reflector trough 70 to deflect outwards next to that chamber. Corrective chambers 74 are inflated to bend neighboring sections of the reflector by pushing on flexible sheets 73, which then pull on flexible sheets 72. This reflector is very similar to that of FIG. 4, with wider sheet 23 corresponding to flexible sheets 72 and 73, and elastic reflector trough 70 corresponding to elastic reflector 1, with the design shown in FIG. 7 having additional flexible divider sheets 75. Support chamber 4 supports the rotator chambers and is held stationary by a tense base sheet 16 and pressure within support chamber 4. Rotator chambers 2 and 3 are pressurized and depressurized to rotate the reflector about pivot seam 15.

FIGS. 8a, 8b show front cross sectional views of a reflector assembly made of a series of sandwich reflectors. FIGS. 8a, 8b show the same assembly in two positions. Optically reflective flexible sheets 94 are suspended between top reflector chamber 93 and bottom reflector chamber 92. Flexible transparent sheets 95 and reflective flexible sheets 94 surround top reflector chamber 93. Flexible sheets 96 and reflective flexible sheets 94 surround bottom reflector chamber 93. The pressure in chambers 92 and 93 is adjusted to control the concavity of reflective sheets 94. Chambers 80 are inflated independently to bend sheets 87, increasing tension between seams 82 and 83 and forcing them closer together, thus changing the angle between the sandwich reflectors. Chambers 92, 93, and 80 are all independently adjustable. The assembly comprising the series of chambers 92, 93, and 80 would collide with sheet 14 as it rotates about axis 86 if this axis stayed still, so chambers 84 and 85 are inflated and deflated to move axis 86 by rotating support chambers 4.

Figure 9:
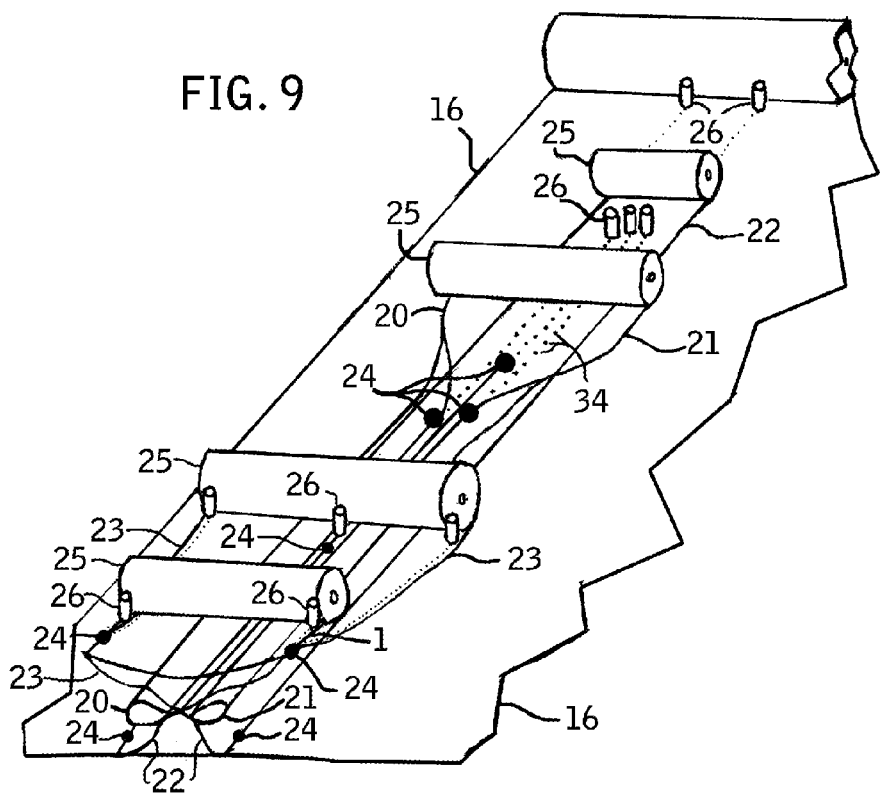
FIG. 9 shows an abstracted view of a way to manufacture the heliostat of FIG. 2, starting with rolls of source material and ending with an inflatable heliostat.

FIG. 9 shows an abstracted, perspective view of a method of manufacture for the inflatable elastic heliostat shown in FIG. 4. Sheets 20/21, 22, 23 and 16, as well as elastic reflector trough 1, are unrolled from source material rolls 25. Printers 26 print patterns 34 as the sheets leave source material rolls 25. Steerable attaching units 24, which follow the printed patterns like a line-following robot would do, attach the sheets together along printed patterns 34 using e.g. heat welding.

Figure 10A:
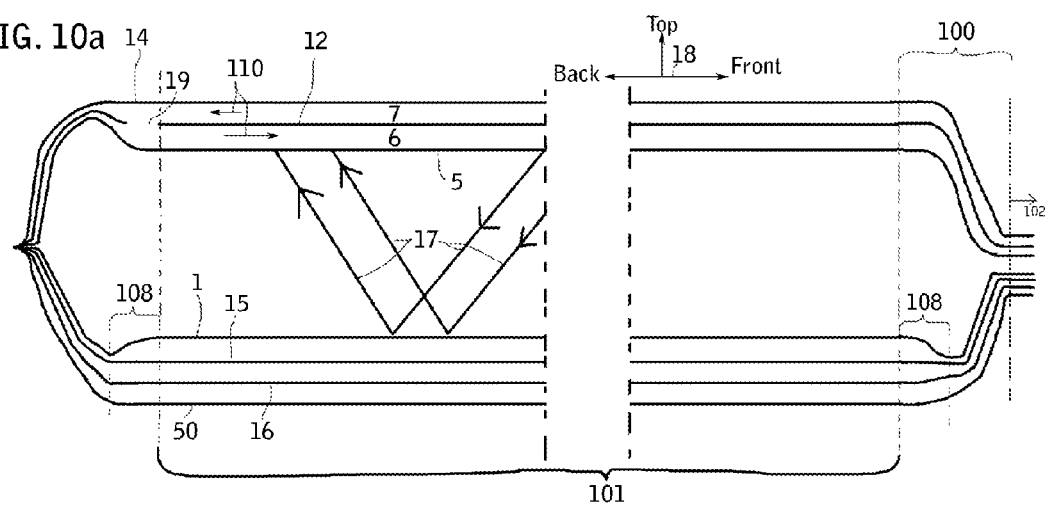
FIG. 10a shows a side cross sectional view of the concentrator units of FIG. 1.

FIG. 10a shows a cross sectional side view of the concentrator unit of FIG. 1. This drawing demonstrates the collector assembly used in all of the designs in this document. Coolant flows through chambers 6 and 7 in the directions shown by arrows 110 (or the opposite direction—both configurations will work). PV cell 5 is able to transfer heat to coolant in chamber 6. Sheet 12 separates chambers 6 and 7, allowing coolant to flow the entire length of the collector and flow through hole 19. Base sheet 16, pivot seam 15, housing sheet 14, bottom sheet 50, light rays 17, linear section 101, tapering sections 108, and elastic reflector 1 are all shown. Coordinate system 18 shows the front, top, and back directions referred to in the descriptions. Tapering sections 108 are where the linear part of the reflector, which is able to rotate, transitions to a tubing section. In tapering section 108, with this reflector design, pivot seam 15 remains linear, while the other parts of the reflector assembly become smaller as they get further away from linear section 101. The PV strip only covers linear section 101, and in tapering section 100 and tubing section 102, the PV strip is connected by electrical wires to control box 141.

Figure 10B:
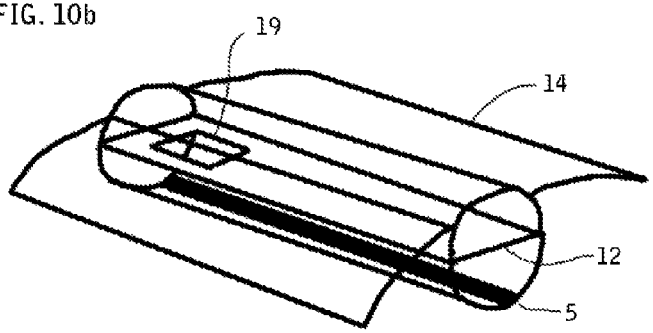
FIG. 10b shows a perspective cutaway view of a coolant chamber and PV strip.

FIG. 10b shows a perspective cutaway view of the collector assembly at the end of the concentrator unit opposite from the tubing that connects to the control box. Hole 19 shows where chamber 6 connects to chamber 7 to allow coolant to flow. Sheet 12 is pictured as opaque in this figure to show the hole 19. PV cell 5 is also shown.

Figure 10C:
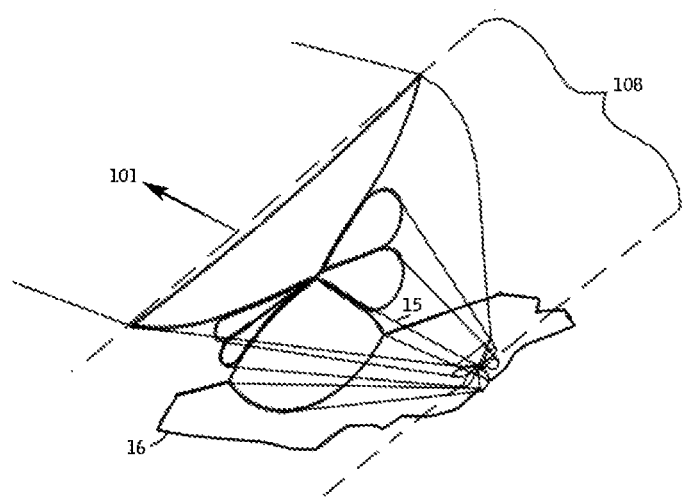
FIG. 10c shows a perspective view of one end of the heliostat of FIG. 2.

FIG. 10c shows the reflector assembly shown in FIG. 4, as it passes through sections 108, in more detail. The sheets get closer to pivot seam 15 as they get further from linear section 101 and closer to the tubing. This allows free rotation of the of the reflector in linear section 101.

Figure 10D:
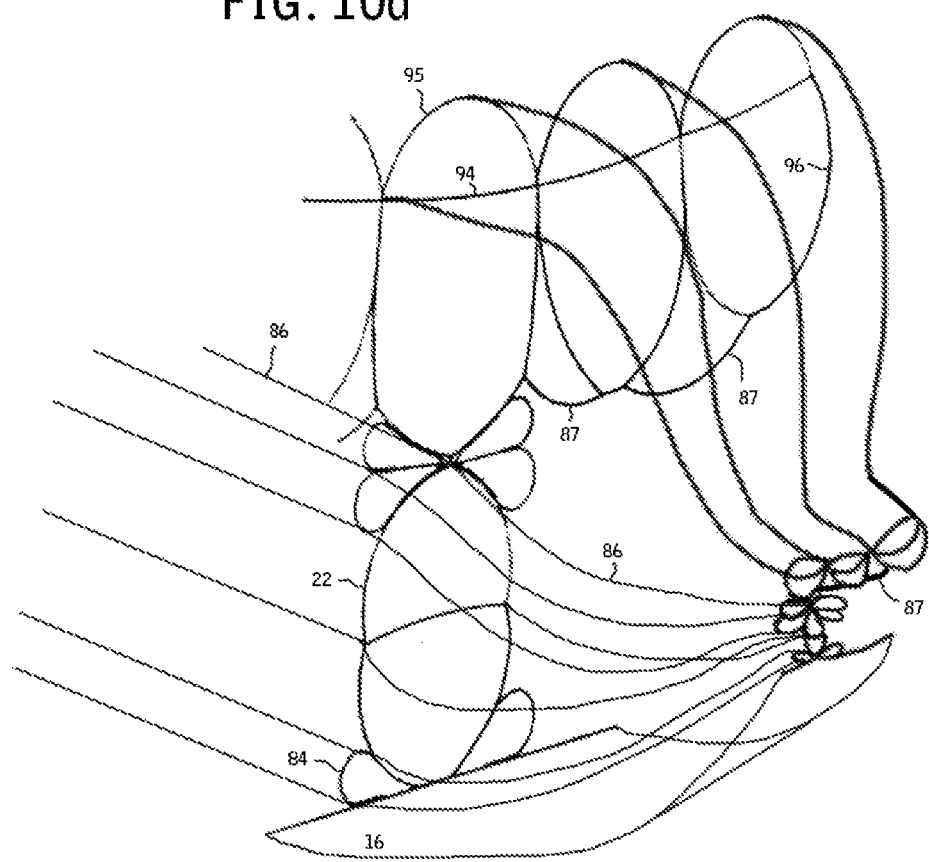
FIG. 10d shows a perspective view of one end of the heliostat of FIG. 8.

FIG. 10d shows the design in FIG. 8a, 8b as it passes through sections 108. Again, the sheets get closer to pivot seam 86 as they get further from the linear section 101. Since pivot seam 86 needs to move in this design, the sheets in the reflector assemblies are kept slack in sections 108 so the linear part of reflector assembly can move freely by taking up slack.

Figure 11:
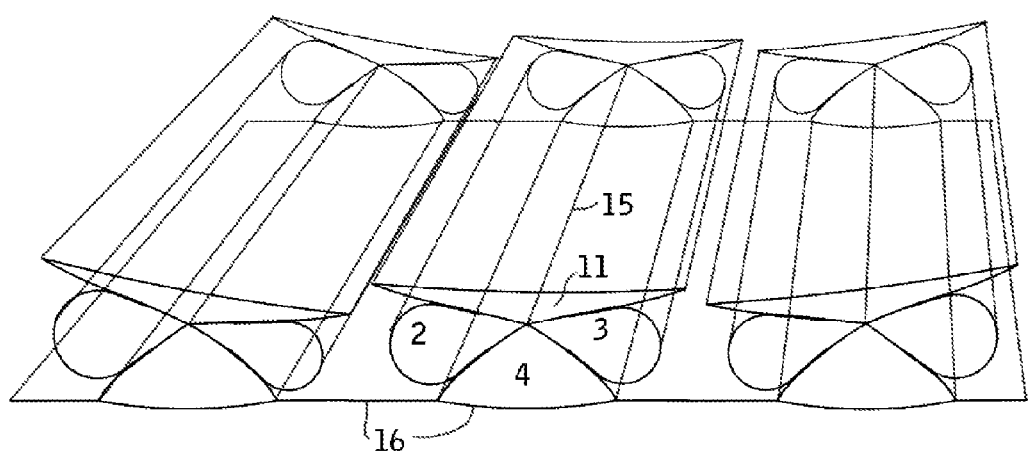
FIG. 11 shows a perspective cutaway view of three of the heliostats of FIG. 2 mounted in parallel on one sheet.

FIG. 11 shows a perspective cutaway view of a linear section of three of the reflectors shown in FIG. 4a, in inflated form, with the reflectors and sheets shown transparent so that the internals can be seen. Support chambers 4 are joined to base sheet 16. Rotator chambers 2 and 3 are shown with different levels of inflation in each of the three heliostats in this drawing. Rotator chambers 2 and 3, support chambers 4 and reflector chambers 11 are all connected at pivot seam 15.

What is claimed is:

1. An inflatable line-focus reflector heliostat comprising:
   (a) a solar reflector means;
   (b) a support chamber being made substantially of thin and flexible material, said support chamber being joined to said reflector means along a pivot seam, said support chamber being joined to a means of support;
   (c) two rotator chambers being made substantially of thin and flexible material, each of said two rotator chambers being joined to said pivot seam and being disposed between said reflector means and said support chamber;
   wherein said solar reflector means, said support chamber, said two rotator chambers, and said pivot seam are elongated along and substantially parallel to a main axis; and
   wherein said support chamber and said two rotator chambers are each substantially air-tight.

2. The apparatus of claim 1, wherein said solar reflector means comprises:
   an airtight top reflector chamber being made substantially of thin, optically transparent, and flexible material;
   an airtight bottom reflector chamber being made substantially of thin and flexible material;
   a middle reflective layer being made of optically reflective, thin and flexible material, said middle reflective layer separating said top reflector chamber from said bottom reflector chamber;
   wherein said bottom reflector chamber is joined to said pivot seam; and
   wherein said top reflector chamber, said bottom reflector chamber, and said middle reflective layer are elongated along and substantially parallel to said main axis.

3. The apparatus of claim 1, wherein said two rotator chambers and said support chamber are each in fluid communication with a respective means of providing inflation and deflation.

4. The apparatus of claim 1, wherein said means of support is a base sheet elongated along and substantially parallel to said main axis, said base sheet being made substantially of thin and flexible material, said base sheet having a top side and a bottom side;
   wherein said support chamber is joined to said top side of said base sheet along seams parallel to said main axis; and
   wherein said support chamber has a substantially fixed position relative to said base sheet when said base sheet is held taut and said support chamber has a higher pressure than its surroundings.

5. The apparatus of claim 4, further comprising a bottom chamber in contact with said bottom side of said base sheet, said bottom chamber being made substantially of thin and flexible material.

6. The apparatus of claim 4, further comprising:
   a housing sheet being made substantially of thin, optically transparent, and flexible material,
      said housing sheet being joined to said top side of said base sheet along two seams elongated along and substantially parallel to said main axis,
      said housing sheet and said base sheet together forming a housing chamber;
   wherein said housing chamber is substantially airtight;
   wherein said housing chamber is elongated along and substantially parallel to said main axis; and
   wherein said support chamber is inside said housing chamber.

7. The apparatus of claim 6, further comprising:
   a coolant chamber joined to said housing sheet and being made substantially of thin and flexible material,
   a photovoltaic strip mounted on said coolant chamber such that said photovoltaic strip can conduct heat energy to a coolant inside said coolant chamber;
   wherein said coolant chamber and said photovoltaic strip are elongated along and substantially parallel to said main axis; and
   wherein said photovoltaic strip is inside said housing chamber and facing said reflector trough.

8. An inflatable line-focus reflector heliostat comprising:
   (a) a wider sheet being made substantially of thin and flexible material;
   (b) a reflector trough being made substantially of thin and elastic material,
      said reflector trough and said wider sheet being sealably joined together along two seams parallel to a main axis, thereby forming a reflector chamber,
      said reflector trough having a substantially parabolic shape and having a convex side and a concave side,
      said reflector trough reversibly deflecting away from said reflector chamber when the pressure inside said reflector chamber is increased,
      said concave side of said reflector trough facing outwards from said reflector chamber and being optically-reflective;
   (c) a support sheet being made substantially of thin and flexible material, said support sheet being joined to said reflector chamber along a pivot seam, said support sheet being joined to a means of support;
   (d) two rotator chambers being made substantially of thin and flexible material, each of said two rotator chambers being joined to said pivot seam and being disposed between said reflector chamber and said support sheet;
   wherein said reflector trough, said wider sheet, said support sheet, said two rotator chambers, and said pivot seam are each elongated along and substantially parallel to said main axis; and
   wherein said reflector chamber and said two rotator chambers are each substantially air-tight.

9. The apparatus of claim 8, wherein said two rotator chambers and said reflector chamber are each in fluid communication with a respective means of providing inflation and deflation.

10. The apparatus of claim 8, further comprising a base sheet being made substantially of thin and flexible material, wherein said support sheet is joined to said base sheet along two seams parallel to said main axis, thereby forming an airtight support chamber.

11. The apparatus of claim 8, further comprising one or more divider sheets being made substantially of thin and flexible material,
- each of said one or more divider sheets being joined to and extending between said reflector trough and said wider sheet,
- each of said one or more divider sheets elongated along and substantially parallel to said main axis,
- said one or more divider sheets splitting said reflector chamber into a plurality of corrective chambers;
- wherein each of said plurality of corrective chambers is airtight and independently pressurizable.

* * * * *